(12) United States Patent
Zhao et al.

(10) Patent No.: US 8,685,851 B2
(45) Date of Patent: Apr. 1, 2014

(54) MOS DEVICE WITH MEMORY FUNCTION AND MANUFACTURING METHOD THEREOF

(75) Inventors: Chao Zhao, Kessel-lo (BE); Wenwu Wang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 15 days.

(21) Appl. No.: 13/139,063

(22) PCT Filed: Jan. 27, 2011

(86) PCT No.: PCT/CN2011/070692
§ 371 (c)(1),
(2), (4) Date: Jun. 10, 2011

(87) PCT Pub. No.: WO2012/075722
PCT Pub. Date: Jun. 14, 2012

(65) Prior Publication Data
US 2012/0146223 A1   Jun. 14, 2012

(30) Foreign Application Priority Data
Dec. 8, 2010   (CN) .......................... 2010 1 0579748

(51) Int. Cl.
*H01L 21/4763*   (2006.01)
*H01L 23/48*   (2006.01)

(52) U.S. Cl.
USPC ........... 438/627; 438/624; 438/637; 438/648; 257/751; 257/760; 257/762; 257/764; 257/E23.16; 257/E21.577; 257/E21.584; 257/E21.585

(58) Field of Classification Search
USPC ............ 257/751, 767, 774, E23.16, E21.584, 257/758, E21.078–E21.084; 438/643, 653, 438/672, 675, 624, 627–629, 637–640, 668
See application file for complete search history.

(56) References Cited

U.S. PATENT DOCUMENTS 6,531,371 B2    3/2003  Hsu
6,576,943 B1 *  6/2003  Ishii et al. ..................... 257/296

(Continued)

FOREIGN PATENT DOCUMENTS

| CN | 101894806 | 11/2010 |
| JP | 2007157941 | 6/2007 |
| JP | 2008159760 | 7/2008 |
| WO | WO2010/119677 | 10/2010 |

OTHER PUBLICATIONS

PCT International Search Report dated Sep. 1, 2011, PCT Application No. PCT/CN2011/070692.

(Continued)

*Primary Examiner* — Jasmine Clark
(74) *Attorney, Agent, or Firm* — Vierra Magen Marcus LLP

(57) ABSTRACT

A manufacturing method of a MOS device with memory function is provided, which includes: providing a semiconductor substrate, a surface of the semiconductor substrate being covered by a first dielectric layer, a metal interconnect structure being formed in the first dielectric layer; forming a second dielectric layer overlying a surface of the first dielectric layer and the metal interconnect structure; forming an opening in the second dielectric layer, a bottom of the opening revealing the metal interconnect structure; forming an alloy layer at the bottom of the opening, material of the alloy layer containing copper and other metal; and performing a thermal treatment to the alloy layer and the metal interconnect structure to form, on the surface of the metal interconnect structure, a compound layer containing oxygen element. The compound layer containing oxygen element and the MOS device formed in the semiconductor substrate constitute a MOS device with memory function. The method provides a processing which has high controllability and improves the performance of devices.

17 Claims, 4 Drawing Sheets

(56) References Cited

U.S. PATENT DOCUMENTS

| | | |
|---|---|---|
| 6,867,996 B2 | 3/2005 | Campbell |
| 6,946,702 B2 | 9/2005 | Jang |
| 7,067,865 B2 | 6/2006 | Lung |
| 7,157,750 B2 | 1/2007 | Bulovic |
| 7,292,469 B2 | 11/2007 | Lee |
| 7,659,626 B2 * | 2/2010 | Nakagawa et al. ........... 257/751 |
| 2011/0074539 A1 | 3/2011 | Tsuji |
| 2011/0151662 A1 * | 6/2011 | Koura et al. .................. 438/653 |

OTHER PUBLICATIONS

Written Opinion of the International Searching Authority dated Sep. 1, 2011, PCT Application No. PCT/CN2011/070692.
English Translation of Abstract of Japanese Patent JP2007157941.
English Translation of Abstract of Japanese Patent JP2008159760.
English Translation of Abstract of Chinese Patent CN101894806.

* cited by examiner

MOS DEVICE WITH MEMORY FUNCTION AND MANUFACTURING METHOD THEREOF

The present application is a Section 371 National Stage Application of International Application No. PCT/CN2011/070692, filed on Jan. 27, 2011, and claims the priority of Chinese Patent Application No. 201010579748.3, filed on Dec. 8, 2010, the entire contents of which are incorporated herein by reference in their entirety.

FIELD OF INVENTION

The present invention relates to the field of semiconductor device and semiconductor manufacturing, and particularly relates to a MOS device with memory function and manufacturing method thereof.

BACKGROUND OF THE INVENTION

The field of devices with memory function is an important branch of semiconductor devices. Resistive random-access memory (RRAM) is an emerging non-volatile memory. The basic idea of RRAM is that a dielectric, which is normally not conductive, is made to conduct through a filament or conduction path formed after application of a voltage sufficiently high. The conduction path formation can arise from different mechanisms, including defects, metal migration, etc. Once the filament is formed, it may be reset (broken, resulting in high resistance) or set (re-formed, resulting in lower resistance) by an appropriately applied voltage. The advantage of RRAM is its simple structure and low processing cost.

There are many different RRAM solutions proposed, such as U.S. Pat. Nos. 6,531,371, 7,292,469, 6,867,996, 7,157,750, 7,067,865 and 6,946,702. Among them, a simple and cheap one is using native CuO formed at the interface of metal-1 Cu and the via between metal-1 Cu and metal-2 Cu as the dielectric. Thus RRAM can be made with the conventional dual-Damascene processing flow.

It has been found that the solution using CuO layer has many issues, including disturbance under small operation voltage and resistance distribution. These issues are mainly relative to the poor controllability of processing. There needs a new RRAM and manufacturing method, to improve the controllability of processing and the performance of devices.

SUMMARY OF THE INVENTION

The present invention is to solve the problem of the poor controllability of conventional processing for manufacturing RRAM and of the poor performance of devices.

To solve the above problem, from the first aspect of the present invention, a manufacturing method of a MOS device with memory function is provided, which includes:

providing a semiconductor substrate, a surface of the semiconductor substrate being covered by a first dielectric layer, a metal interconnect structure being formed in the first dielectric layer;

forming a second dielectric layer overlying a surface of the first dielectric layer and the metal interconnect structure;

forming an opening in the second dielectric layer, a bottom of the opening revealing the metal interconnect structure;

forming an alloy layer at the bottom of the opening, the alloy layer is composed of copper and another metal or other metals; and performing a thermal treatment to the alloy layer and the metal interconnect structure to form, at the interface of the metal interconnect structure and the alloy layer, a complex metal oxide layer.

Optionally, the material of the alloy layer is Cu—Mg alloy, Cu—Mn alloy, Cu—Ni alloy, Cu—Co alloy, Cu—Zn alloy or Cu—Sn alloy.

Optionally, the concentration of a metal except Cu in the alloy is from 1% to 99%.

Optionally, the concentration of the metal in the alloy is from 1% to 20%.

Optionally, the alloy layer is formed by physical vapor deposition, chemical vapor deposition or atomic layer deposition.

Optionally, after forming the opening and before forming the alloy layer, the manufacturing method further includes: performing an oxidation treatment to the surface of the metal interconnect structure.

Optionally, the oxidation treatment to the surface of the metal interconnect structure is thermal oxidation or oxygen ion implantation.

Optionally, the metal interconnect structure is a W contact plug, a Cu contact plug, or a Cu trench or Cu via in metal interconnect.

Optionally, the alloy layer further overlies a surface of a sidewall of the opening in the second dielectric layer.

Optionally, a MOS transistor is formed in the semiconductor substrate, and the metal interconnect structure is electrically connected with a source and/or drain of the MOS transistor.

Optionally, after forming the alloy layer and before performing the thermal treatment, the manufacturing method further includes: forming copper on the alloy layer to fill the opening.

Optionally, after performing the thermal treatment to the alloy layer and the metal interconnect structure, the manufacturing method further includes: forming copper on the alloy layer to fill the opening.

To solve the above problem, from the second aspect of the present invention, a MOS device with memory function is provided, which includes:

a semiconductor substrate;

a first dielectric layer overlying a surface of the semiconductor substrate, a metal interconnect structure being formed in the first dielectric layer;

a second dielectric layer overlying a surface of the first dielectric layer and the metal interconnect structure, an opening being formed in the second dielectric layer, a bottom of the opening revealing the metal interconnect structure; and a barrier layer overlying the bottom and a sidewall of the opening, material of the barrier layer being metal oxide layer.

Optionally, the material of the barrier layer is $MgO_x$, $MnO_x$, $NiO_x$, $CoO_x$, $ZnO_x$ or $SnO_x$.

Optionally, the metal interconnect structure is a W contact plug, a Cu contact plug, or a Cu trench or Cu via in metal interconnect.

Optionally, a MOS transistor is formed in the semiconductor substrate, and the metal interconnect structure is electrically connected with a source and/or drain of the MOS transistor.

Optionally, the MOS device with memory function further includes copper on the barrier layer, the copper filling the opening.

In comparison with conventional technologies, the present invention has the following advantages:

The above solution includes steps: forming a first dielectric layer on a semiconductor substrate, a metal interconnect structure being formed in the first dielectric layer; forming a second dielectric layer overlying a surface of the first dielectric layer and the metal interconnect structure, forming an opening in the second dielectric layer, a bottom of the opening revealing the metal interconnect structure; then forming an alloy layer at the bottom of the opening, material of the alloy layer containing copper and another metal or other metals; then conducting a thermal treatment to the alloy layer and the metal interconnect structure to form, on the surface of the metal interconnect structure, a metal oxide layer. After the thermal treatment, other metal (or metals) in the alloy layer except Cu reacts with oxygen element on the surface of the metal interconnect structure, which generates metal oxide. The metal oxide will play a role of RRAM dielectric. The manufacturing procedure uses a self-aligned metal oxide with tunable thickness and properties; therefore, the processing has high controllability and generates devices with high performance.

Furthermore, before forming the alloy layer, the method can further include: performing an oxidation treatment to the surface of the metal interconnect structure, which can increase the thickness of the metal oxide layer, thus improving the storage function. The final metal oxide layer is formed by oxidizing the second metal precipitated from the alloy layer.

In addition, the alloy layer in the manufacturing method can cover the surface of the second dielectric layer exposed at the sidewall of the opening. After the thermal treatment, a metal oxide layer is formed on the sidewall of the opening, which plays a role of Cu diffusion barrier to suppress the diffusion of the copper. The manufacturing method skips the steps for forming a Ta-based barrier layer in conventional dual-Damascene processing flow, which allows a simpler processing.

DESCRIPTION OF THE PREFERRED EMBODIMENTS

There are problems of the poor controllability of conventional processing for manufacturing RRAM, and of the poor performance of devices.

In an embodiment of the present invention, the manufacturing method of a MOS device with memory function includes steps: forming a first dielectric layer on a semiconductor substrate, a metal interconnect structure being formed in the first dielectric layer; forming a second dielectric layer overlying a surface of the first dielectric layer and the metal interconnect structure, forming an opening in the second dielectric layer, a bottom of the opening revealing the metal interconnect structure; then forming an alloy layer at the bottom of the opening, material of the alloy layer containing copper and another metal (M) or other metals (M, M1, . . . ); then performing a thermal treatment to the structure After the thermal treatment, the metal (or metals) except Cu in the alloy layer will precipitate from the alloy layer, and reacts with oxygen element on the interface of the alloy seed and the metal interconnect structure, which generates metal oxide. The metal oxide can be used as a memory dielectric. The manufacturing procedure uses a self-aligned metal oxide with tunable thickness and properties; therefore, the processing has high controllability and generates devices with high performance.

Furthermore, before forming the alloy layer, the method can further include: performing an oxidation treatment to the surface of the metal interconnect structure, which can increase the thickness of the final metal oxide layer, thus improving the memory performance. The metal oxide layer is formed by oxidizing the metal precipitated from the alloy layer.

In addition, the alloy layer in the manufacturing method can cover the surface of the second dielectric layer at a sidewall of the opening. After the thermal treatment, a metal oxide layer is formed on the sidewall of the opening, which can be used as a barrier layer of the copper. The manufacturing method skips the steps for forming a Ta-based barrier layer in conventional dual-Damascene processing flow, which allows a simpler processing.

Hereunder, the present invention will be described in detail with reference to embodiments, in conjunction with the accompanying drawings.

Embodiments to which the present invention is applied are described in detail below. However, the invention is not restricted to the embodiments described below.

Figure 1:
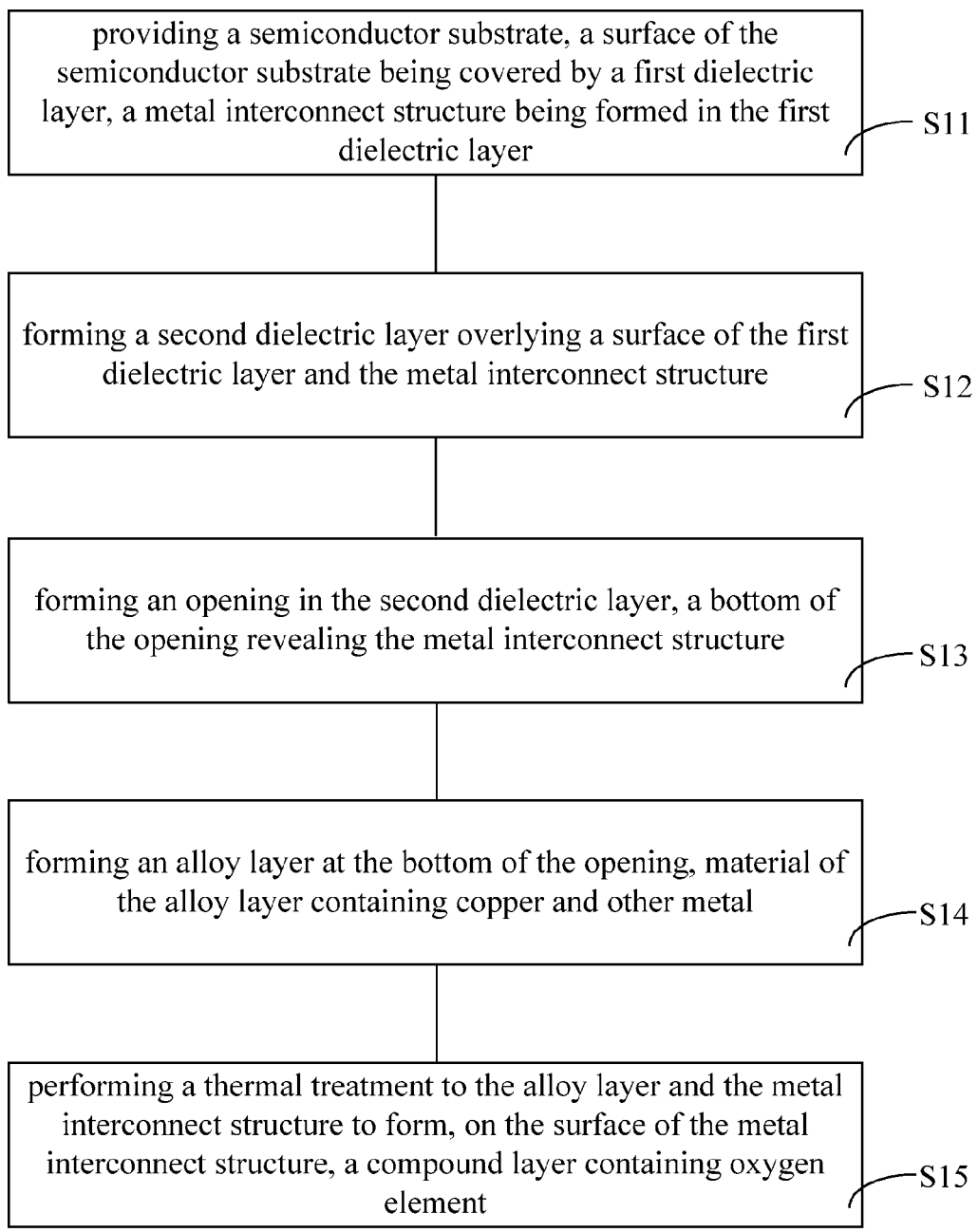
FIG. 1 is a flow diagram of the manufacturing method of a MOS device with memory function in an embodiment of the present invention.

FIG. 1 is a flow diagram of the manufacturing method of a MOS device with memory function in an embodiment of the present invention. The manufacturing method includes:

S11, providing a semiconductor substrate, a surface of the semiconductor substrate being covered by a first dielectric layer, a metal interconnect structure being formed in the first dielectric layer;

S12, forming a second dielectric layer overlying a surface of the first dielectric layer and the metal interconnect structure;

S13, forming an opening in the second dielectric layer, a bottom of the opening revealing the metal interconnect structure;

S14, forming an alloy layer at the bottom of the opening, material of the alloy layer containing copper and another metal, or other metals; S15, performing a thermal treatment to the alloy layer and the metal interconnect structure to form, on the surface of the metal interconnect structure, a metal oxide layer.

FIG. 2 to FIG. 8 are cross-sectional views of the intermediate structures after the steps of the processing flow for manufacturing the MOS device with memory function in another embodiment of the present invention.

Figure 2:
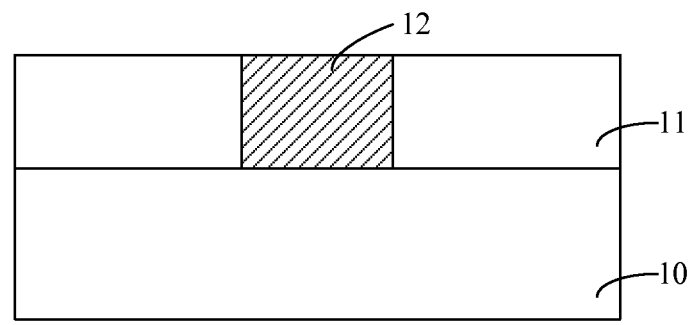
FIG. 2 to FIG. 8 are the cross-sectional views of the intermediate structures after the steps of the processing flow for manufacturing the MOS device with memory function in another embodiment of the present invention.

Referring to FIG. 1 and FIG. 2, step S11 is performed as: providing a semiconductor substrate, a surface of the semiconductor substrate being covered by a first dielectric layer, a metal interconnect structure being formed in the first dielectric layer. Specifically, as shown in FIG. 2, a semiconductor substrate 10 is provided. The semiconductor substrate 10 can be silicon substrate, silicon germanium substrate, substrate made from a compound of the III-V family, SiC substrate or any combination of thereof; and can be silicon-on-insulator substrate, or any known substrate to one skilled in the art. In the embodiment, the semiconductor substrate 10 is a silicon substrate, in which a MOS transistor is formed (now shown in FIG. 2).

A first dielectric layer 11 is formed on the semiconductor substrate 10. The material of first dielectric layer 11 can be silicon oxide, doped silica glass, etc. A metal interconnect structure 12 is formed in the first dielectric layer 11. The metal interconnect structure can be W contact plug or Cu contact plug, such as a W contact plug or a Cu contact plug which is electrically connected with the source or drain of the MOS transistor in the semiconductor substrate 10. The metal interconnect structure 12 can also be a Cu trench or a Cu via in metal interconnect, such as a Cu trench or a Cu via in the first copper layer, a Cu trench or a Cu via in the second copper layer, a Cu trench or a Cu via in the third copper layer, etc.

Figure 3:
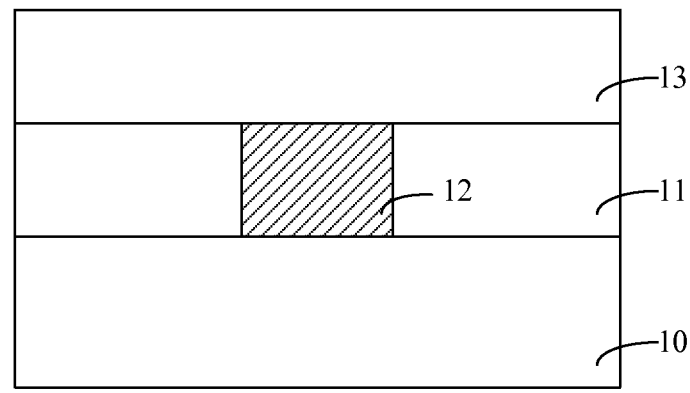

Referring to FIG. 1 and FIG. 3, step S12 is performed as: forming a second dielectric layer overlying a surface of the first dielectric layer and the metal interconnect structure. Specifically, second dielectric layer 13 is formed on the surface of the first dielectric layer 11 and the metal interconnect structure 12. The material of the second dielectric layer 13 can be common interlayer dielectric materials between metal layers. Preferably, the material of second dielectric layer 13 is low dielectric constant (low-k) material, such as SiCOH, SiCON, etc. The second dielectric layer 13 can be formed by chemical vapor deposition (CVD), PECVD, etc.

Figure 4:
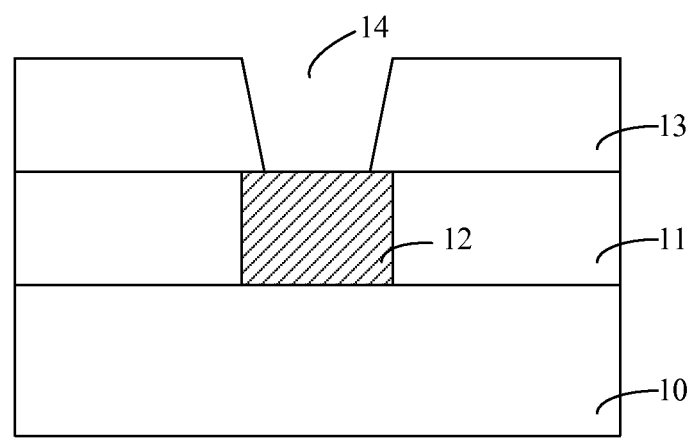

Referring to FIG. 1 and FIG. 4, step S13 is performed as: forming an opening in the second dielectric layer, bottom of the opening revealing the metal interconnect structure. Specifically, an opening 14 is formed in the second dielectric layer 13, and the bottom of the opening 14 reveals the surface of the metal interconnect structure 12. The method to form the opening 14 may includes: forming a photoresist layer on the surface of the second dielectric layer 13, and patterning the photoresist layer to define the pattern of opening 14; etching the second dielectric layer 13 with the patterned photoresist layer as a mask, to form the opening 14; and removing the photoresist layer by ashing. The opening 14 may be a via, a trench, or a combination thereof in conventional dual-Damascene processing.

Referring to FIG. 1 and FIGS. 5-7, step S14 is performed as: forming an alloy layer at the bottom of the opening, material of the alloy layer containing copper and other metal.

Figure 5:
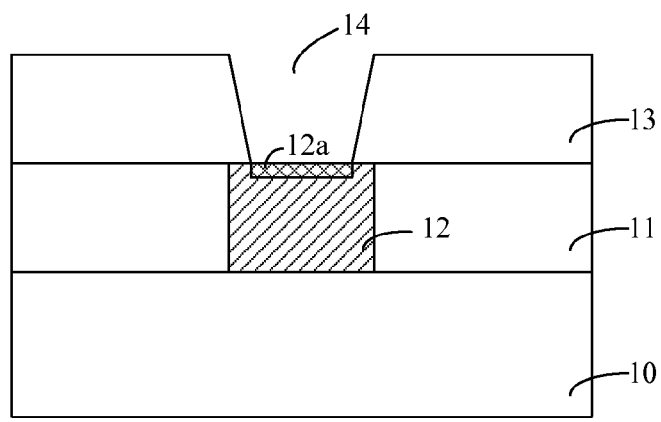

Specifically, referring to FIG. 5, an oxidation treatment to the surface of the metal interconnect structure 12 at the bottom of the opening 14 is performed, which forms an oxide layer 12a on the surface of the metal interconnect structure 12 revealed at the bottom of the opening 14. In the embodiment, the oxidation treatment to the surface of the metal interconnect structure 12 may be thermal oxidation or oxygen ion implantation.

It should be noted that the above oxidation treatment is optional, in some embodiments, the oxidation treatment to the surface of the metal interconnect structure 12 is not performed. Even without oxidation treatment, there will be an oxide layer on the surface of the metal interconnect structure 12 at the bottom of the opening 14, caused by natural oxidation.

Figure 6:
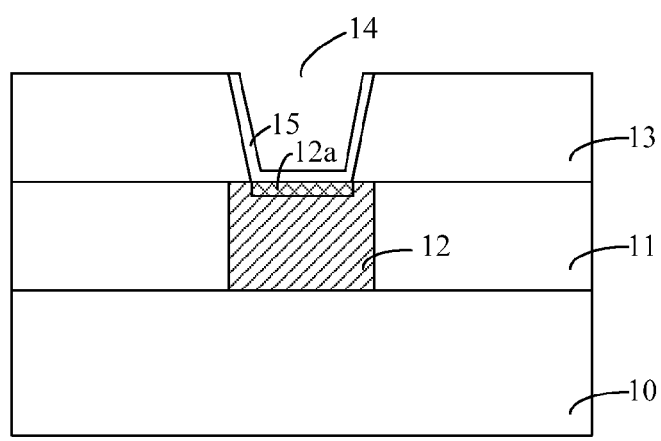

Then referring to FIG. 6, an alloy layer 15 is formed at the bottom of the opening 14. In this embodiment, the alloy layer 15 also covers the sidewall of the opening 14. Specifically, the alloy layer 15 covers the second dielectric layer 13 at the sidewall of the opening 14. The material of the alloy layer 15 is a solid solution alloy of copper and other metals. Preferably, the material of the alloy layer 15 is Cu—Mg alloy, Cu—Mn alloy, Cu—Ni alloy, Cu—Co alloy, Cu—Zn alloy or Cu—Sn alloy. The concentration of the metal, except Cu, in the alloy layer 15 is from 1% to 99%, and preferably, from 1% to 20%. For example, in Cu—Mg alloy, the concentration of Mg is 1%~20%.

The method to form the alloy layer 15 can be physical vapor deposition (PVD), chemical vapor deposition (CVD), or atomic layer deposition (ALD). In this embodiment, the alloy layer 15 is formed by physical vapor deposition. Specifically, after physical vapor deposition, the alloy layer 15 covers the bottom and the sidewall of the opening 14 and the surface of the second dielectric layer 13.

Figure 7:
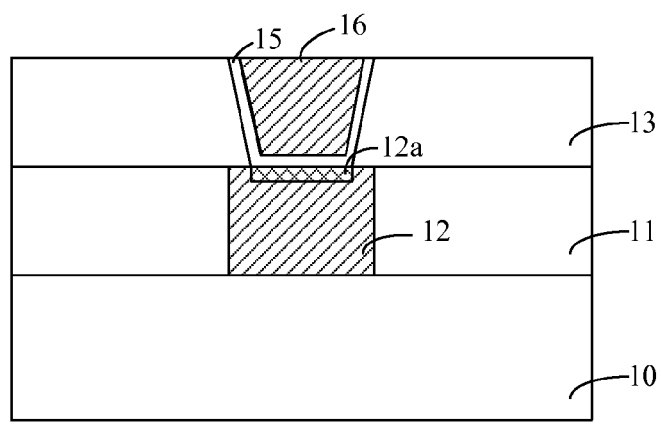

Then referring to FIG. 7, copper 16 is formed on the alloy layer 15 to fill the opening. The method to form the copper 16 is Electro Plating. After being formed, the copper 16 is subject to a planarization process, to make the surface of the copper 16 on the same level with the surface of the second dielectric layer 13. The planarization process can be chemical mechanical polishing (CMP). In this step, the alloy layer 15 can be used as a seed layer for the plating process, which benefits the filling of the copper 16.

Figure 8:
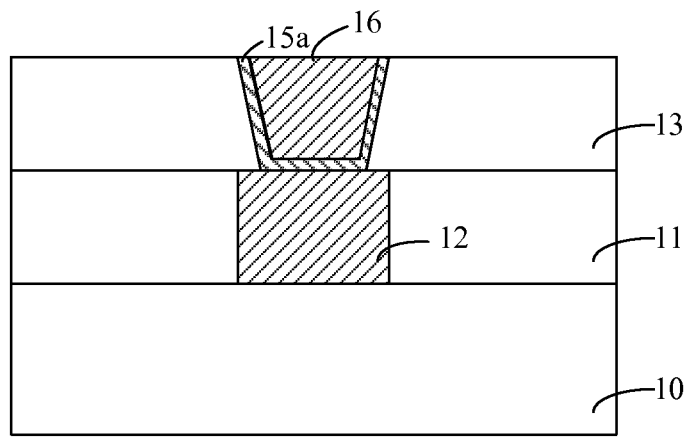

Referring to FIG. 1 and FIG. 8, step S15 is performed as: performing a thermal treatment to the alloy layer and the metal interconnect structure to form, at the interface of the alloy and the metal interconnect structure, a final metal oxide layer. Specifically, a thermal treatment, which is performed to the alloy layer and the metal interconnect structure 12, can be annealing and other types of common thermal treatment process. After the thermal treatment, other metal (or metals) except Cu is precipitated from the alloy layer, and reacts with oxygen element in the oxide layer on the surface of the metal interconnect structure, which generates metal oxide layer 15a on the surface of the metal interconnect structure 12 and at the bottom of the copper 16; and oxygen element in the second dielectric layer 13 is also consumed, which also generates metal oxide layer 15a on the sidewall of the copper 16. The above reaction process is self-aligned; and the thickness of the metal oxide layer 15a can be adjusted by changing the concentration of other metal (metals) in the alloy layer and by changing the thickness of the alloy layer, which improves the controllability of the processing. According to the different materials of the alloy layer, the material of the metal oxide layer 15a can be $MgO_x$, $MnO_x$, $NiO_x$, $CoO_x$, $ZnO_x$ or $SnO_x$.

The metal oxide layer 15a at the bottom of the copper 16 can be used as a memory dielectric. The memory function can be achieved by applying voltage to the metal interconnect structure 12 and the copper 16 which makes the metal oxide layer 15a switch between high-resistance and low-resistance state. In this embodiment, oxidation treatment has been performed to the surface of the metal interconnect structure 12 before the formation of the Cu alloy, which increases the thickness of the metal oxide layer 15a on the surface of the metal interconnect structure 12 by incorporating more oxygen on the bottom opening; the increase of the thickness of the metal oxide layer 15a improves the memory function. If the oxidation treatment is not performed, a metal oxide layer 15a is generated by the reaction of the other metal (metals) except Cu precipitated from the alloy layer with the oxygen element in native oxide layer; and the final metal oxide layer 15a can be used as a memory dielectric to achieve memory function.

In this embodiment, since the alloy layer directly covers the sidewall of the opening in the second dielectric layer 13, the metal oxide layer 15a is also generated at the sidewall of the copper 16. This part of metal oxide layer 15a can be used as a self-aligned barrier layer to prevent copper ions from diffusing into the second dielectric layer 13. Therefore, there is no need to form other barrier layers before forming the copper 16, which decreases the process complexity. Conventional material of barrier layer is tantalum and tantalum nitride bilayer, which tends to be thick (>5 nm) and can not meet the needs of device size scaling. The present method enables scaling down the device size and at the same time, combining the self-aligned barrier with the self-aligned RRAM dielectric.

It should be noted that in this embodiment, a thermal treatment is performed after forming the copper 16; the other metal (metals) except Cu in the alloy layer is precipitated and reacts with oxygen existing at the interface of the alloy seed and the interconnect metal structure to form the metal oxide layer 15a. In other embodiments, the thermal treatment can be performed after forming the alloy layer and before forming the copper 16.

Figure 9:
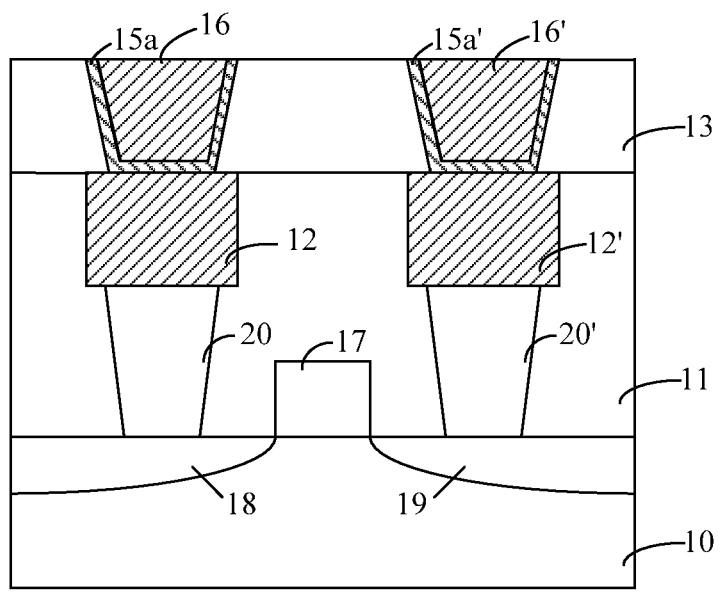
FIG. 9 is a cross-sectional view of detailed structure of the MOS device with memory function in still another embodiment of the present invention.

FIG. 9 is a cross-sectional view of detailed structure of a MOS device with memory function in still another embodiment of the present invention. The MOS device with memory function includes: a semiconductor substrate 10, a MOS transistor being formed on the semiconductor substrate 10, the MOS transistor including a gate stack structure 17, and a source 18 and a drain 19 in the semiconductor substrate 10 on each side of the gate stack structure 17; a first dielectric layer 11 overlying the surface of the semiconductor substrate 10, a metal interconnect structure 12 and a metal interconnect structure 12' being formed in the first dielectric layer 11, the metal interconnect structure 12 and the metal interconnect structure 12' being W contact plug, Cu contact plug, or Cu trench or Cu via in metal interconnect, wherein in this embodiment, the metal interconnect structure 12 and the metal interconnect structure 12' are Cu trench in the first metal layer, the metal interconnect structure 12 is connected with source 18 via a W contact plug 20, and the metal interconnect structure 12' is connected with the drain 19 via a W contact plug 20'; a second dielectric layer 13 overlying the surface of the first dielectric layer 11, the metal interconnect structure 12 and the metal interconnect structure 12', openings being formed in the second dielectric layer 13, the bottom of the openings revealing the metal interconnect structure 12 and the metal interconnect structure 12' respectively; a metal oxide 15a and a metal oxide 15a' overlying the bottoms and sidewalls of the openings in second dielectric layer 13 respectively; a copper 16 and a copper 16' forming respectively on the metal oxide 15a and metal oxide 15a', which fill the openings. The metal oxide 15a and the metal oxide 15a' at the bottom of the openings are used as memory dielectric, to achieve storage function. The metal oxide 15a and the metal oxide 15a' at the sidewall of the openings are used as barrier layer, to prevent copper ions from diffusing.

FIG. 9 just shows an embodiment, in which a metal oxide 15a with memory function and a metal oxide 15a' with memory function are formed respectively above the source 18 and drain 19 of the MOS transistor. In other embodiments, there may be only one metal oxide with memory function formed above one of the source 18 and drain 19, and a conventional dual-Damascene structure via or single-Damascene via formed above the other of the source 18 and drain 19.

In conclusion, the above solution includes steps: forming a first dielectric layer on a semiconductor substrate, a metal interconnect structure being formed in the first dielectric layer; forming a second dielectric layer overlying a surface of the first dielectric layer and the metal interconnect structure, forming an opening in the second dielectric layer, a bottom of the opening revealing the metal interconnect structure; then forming an alloy layer at the bottom of the opening, material of the alloy layer containing copper and other metal; then performing a thermal treatment to the alloy layer and the metal interconnect structure to form, on the surface of the metal interconnect structure, a metal oxide layer. After the thermal treatment, other metal (or metals) except Cu is precipitated from the alloy layer and reacts with oxygen element on the surface of the metal interconnect structure, which generates metal oxide. The metal oxide can be used as a memory dielectric for memory function. The manufacturing procedure uses a self-aligned metal oxide with tunable thickness and properties; therefore, the processing has high controllability and generates devices with high performance.

Furthermore, before forming the alloy layer, the method can further include: performing an oxidation treatment to the surface of the metal interconnect structure, which can increase the thickness of the metal oxide layer, thus improving the memory function.

In addition, the alloy layer in the manufacturing method can cover the surface of the second dielectric layer at the sidewall of the opening. After the thermal treatment, a metal oxide layer is formed on the sidewall of the opening, which can be used as a barrier layer of the copper. The manufacturing method skips the steps for forming a barrier layer in conventional dual-Damascene processing flow, which allows a simpler processing.

Although the present invention has been illustrated and described with reference to the preferred embodiments of the present invention, those ordinary skilled in the art shall appreciate that various modifications in form and detail may be made without departing from the spirit and scope of the invention.

The invention claimed is:

1. A manufacturing method of a MOS device with memory function, comprising:
   providing a semiconductor substrate, a surface of the semiconductor substrate being covered by a first dielectric layer, a metal interconnect structure being formed in the first dielectric layer;
   forming a second dielectric layer overlying a surface of the first dielectric layer and the metal interconnect structure;
   forming an opening in the second dielectric layer, a bottom of the opening revealing the metal interconnect structure;
   forming an alloy layer at the bottom of the opening, material of the alloy layer containing copper and other metal; and
   performing a thermal treatment to the alloy layer and the metal interconnect structure to form, on the surface of the metal interconnect structure, a compound layer containing oxygen element wherein a portion of the compound layer containing oxygen element at the bottom of the opening has a memory function.

2. The manufacturing method of claim 1, wherein the material of the alloy layer is Cu—Mg alloy, Cu—Mn alloy, Cu—Ni alloy, Cu—Co alloy, Cu—Zn alloy or Cu—Sn alloy.

3. The manufacturing method of claim 2, wherein concentration of a metal, except Cu, in the alloy is from 1% to 99%.

4. The manufacturing method of claim 3, wherein concentration of the metal in the alloy is from 1% to 20%.

5. The manufacturing method of claim 1, wherein the alloy layer is formed by physical vapor deposition, chemical vapor deposition or atomic layer deposition.

6. The manufacturing method of claim 1, wherein after forming the opening and before forming the alloy layer, the manufacturing method further comprises: performing an oxidation treatment to the surface of the metal interconnect structure.

7. The manufacturing method of claim 6, wherein the oxidation treatment to the surface of the metal interconnect structure is thermal oxidation or oxygen ion implantation.

8. The manufacturing method of claim 1, wherein the metal interconnect structure is a W contact plug, a Cu contact plug, or a Cu trench or Cu via in metal interconnect.

9. The manufacturing method of claim 1, wherein the alloy layer further overlies a surface of the second dielectric layer at a sidewall of the opening.

10. The manufacturing method of claim 1, wherein a MOS transistor is formed in the semiconductor substrate, and the metal interconnect structure is electrically connected with a source and/or drain of the MOS transistor.

11. The manufacturing method of claim 1, wherein after forming the alloy layer and before performing the thermal treatment, the manufacturing method further comprises: forming copper on the alloy layer to fill the opening.

12. The manufacturing method of claim 1, wherein after performing the thermal treatment to the alloy layer and the metal interconnect structure, the manufacturing method further comprises: forming copper on the alloy layer to fill the opening.

13. A MOS device with memory function, comprising:
a semiconductor substrate;
a first dielectric layer overlying a surface of the semiconductor substrate, a metal interconnect structure being formed in the first dielectric layer;
a second dielectric layer overlying a surface of the first dielectric layer and the metal interconnect structure, an opening being formed in the second dielectric layer, a bottom of the opening revealing the metal interconnect structure; and
a barrier layer formed from an alloy layer;
wherein an alloy layer is formed at the bottom of the opening, and material of the alloy layer contains copper and other metal; and
wherein a portion of the alloy layer at the bottom of the opening has a memory function.

14. The MOS device with memory function of claim 13, wherein the material of the barrier layer is $MgO_x$, $MnO_x$, $NiO_x$, $CoO_x$, $ZnO_x$ or $SnO_x$.

15. The MOS device with memory function of claim 13, wherein the metal interconnect structure is a W contact plug, a Cu contact plug, or a Cu trench or Cu via in metal interconnect.

16. The MOS device with memory function of claim 13, wherein a MOS transistor is formed in the semiconductor substrate, and the metal interconnect structure is electrically connected with a source and/or drain of the MOS transistor.

17. The MOS device with memory function of claim 13, further comprising copper on the barrier layer, the copper filling the opening.

* * * * *